(12) United States Patent  (10) Patent No.: US 7,440,737 B2
Su  (45) Date of Patent: Oct. 21, 2008

(54) NOISE BLANKER CONTROL

(75) Inventor: Jie Su, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 410 days.

(21) Appl. No.: 11/215,776

(22) Filed: Aug. 30, 2005

(65) Prior Publication Data

US 2007/0049227 A1   Mar. 1, 2007

(51) Int. Cl.
*H04B 1/10* (2006.01)
*H04Q 7/20* (2006.01)

(52) U.S. Cl. ...................... 455/223; 455/296

(58) Field of Classification Search ......... 455/222–224, 455/212, 296–297, 312
See application file for complete search history.

(56) References Cited

U.S. PATENT DOCUMENTS

| | | | | |
|---|---|---|---|---|
| 4,856,084 A | * | 8/1989 | Richards, Jr. | ............... 455/223 |
| 5,603,112 A | * | 2/1997 | Gabato et al. | ............ 455/226.2 |
| 5,890,059 A | * | 3/1999 | Shoemaker et al. | ......... 455/297 |
| 6,577,851 B1 | * | 6/2003 | Ecklund et al. | ............. 455/223 |
| 2004/0203551 A1 | | 10/2004 | Li et al. | |

\* cited by examiner

*Primary Examiner*—Lee Nguyen
(74) *Attorney, Agent, or Firm*—Charles W. Bethards

(57) ABSTRACT

A noise blanker for use in a radio receiver includes an audio blanker (115) configured to mitigate impulse noise associated with a signal received by the radio receiver and a blanker controller (117) configured to selectively enable the audio blanker and further comprising at least a first blanker enabler and a second blanker enabler. The noise blanker controlled and corresponding method (500) can include a first noise detector, e.g., MPX noise detector (213), configured to provide a first signal when impulse noise is detected in a demodulated signal and a second noise detector, e.g., log RSSI noise detector (211), configured to provide a second signal when impulse noise is detected in a modulated signal, and a logic function (217) coupled to the first and second signals and configured to provide an enable signal to the noise blanker when the first signal or the second signal is provided. Note that in addition to or in lieu of either of the noise detectors, a switching enabler (215), responsive, e.g., to diversity switching controller (125) or other indications of a state change, can provide a signal to the logic function and thus enable the audio blanker.

18 Claims, 4 Drawing Sheets

NOISE BLANKER CONTROL

FIELD OF THE INVENTION

This invention relates in general to receivers and more specifically to techniques and noise blankers in a receiver.

BACKGROUND OF THE INVENTION

Radio receivers are known and the use of noise blankers in receivers, such as frequency modulated (FM) broadcast receivers used in automobiles and the like is also known. Generally noise blankers are used to eliminate or mitigate the impact of noise, such as noise that may be generated by ignition systems and the like, on the resultant audio.

One way of assessing the impact of the noise is to apply a "standardized" noise source along with a variable level radio frequency signal without modulation to an input of a receiver and measure residual noise at the speakers as a function of the level of the radio frequency signal at the input. This measured residual noise is compared to the level of the signal at the speakers when a variable level modulated radio frequency is applied. It is desired that the residual noise level be as low as possible.

Often the noise blanker is implemented and operates on a demodulated signal and may be referred to as an audio blanker. Typically audio blankers inherently do some harm to audio quality or fidelity and thus should only operate when the harm done is offset by the noise mitigation. Thus the audio blanker will generally need to be enabled or controlled. Often a noise detector is used to detect noise and when detected enable the audio blanker. Known noise detectors tend to have falsing problems (false positive indications of noise or failure to detect actual noise) under various conditions, e.g., signal levels, noise characteristics, and the like.

BRIEF DESCRIPTION OF THE DRAWINGS

The accompanying figures where like reference numerals refer to identical or functionally similar elements throughout the separate views and which together with the detailed description below are incorporated in and form part of the specification, serve to further illustrate various embodiments and to explain various principles and advantages all in accordance with the present invention.

DETAILED DESCRIPTION

Figure 1:
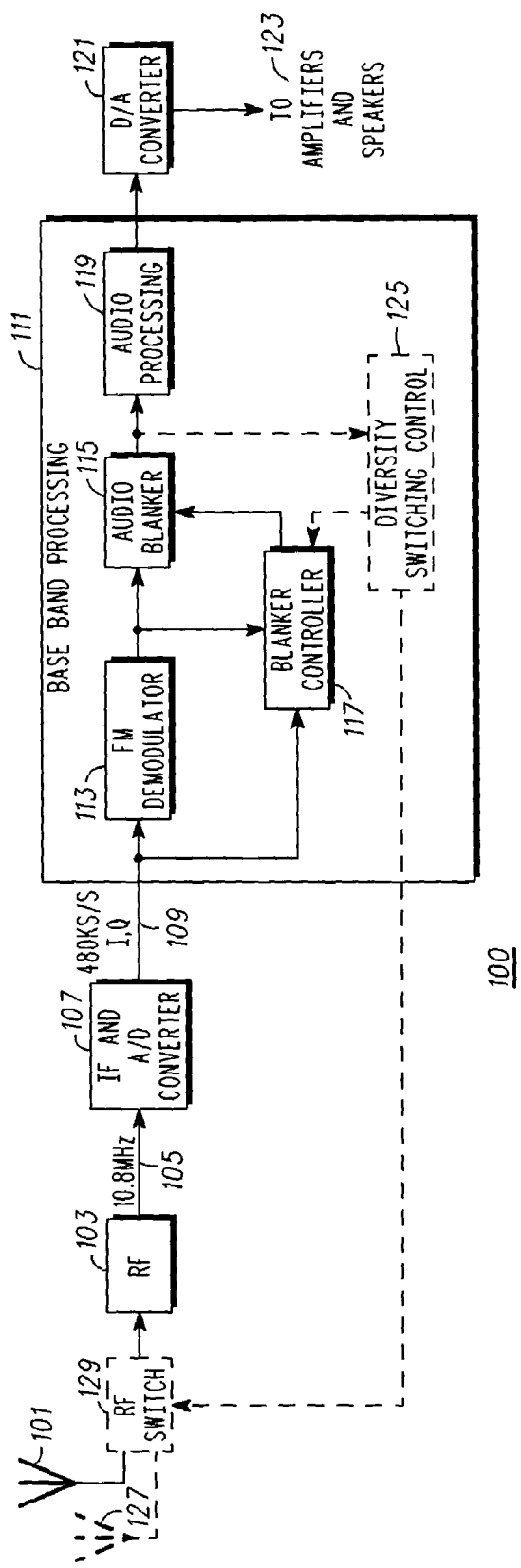
FIG. 1 depicts in a simplified and representative form, a high level block diagram of a receiver using a noise blanker in accordance with one or more embodiments.

In overview, the present disclosure concerns receivers and associated noise blankers, and more specifically techniques and apparatus for enabling or controlling such noise blankers under varying circumstances, thereby enhancing the mitigation of noise that the noise blanker may have in those situations. More particularly various inventive concepts and principles embodied in methods and apparatus, e.g., receivers, blankers, blanker controllers, integrated circuits and firmware, and the like for selectively enabling a blanker in accordance with a plurality of blanker enablers, e.g., noise detectors or switching enablers, thereby improving the extent to which or range of circumstances in which the blanker can improve noise reduction will be discussed and disclosed.

The apparatus in various embodiments of particular interest may be or include receivers or the like for receiving and otherwise processing Frequency Modulated (FM) signals, such as FM broadcast signals or similar signals. These receivers may be employed in various transportation vehicles, such as automobiles, trucks, or similar vehicles as well as other forms of equipment such as construction or agricultural equipment and the like. These receivers may be found in various forms of entertainment equipment, including portable and home based receivers and the like. Such receivers or the noise blanker portion thereof may be subject to various noise signals and the like where the noise signals have significant energy within the normal signal bandwidth. Systems, equipment and devices constructed and operating to receive multiplexed signals, e.g., FM broadcast signals, may advantageously utilize one or more of the methods and apparatus described below when practiced in accordance with the inventive concepts and principles as taught herein.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms, if any, such as first and second, top and bottom, and the like are used solely to distinguish one from another entity or action without necessarily requiring or implying any actual such relationship or order between such entities or actions.

Much of the inventive functionality and many of the inventive principles are best implemented with or in integrated circuits (ICs) including possibly application specific ICs or ICs with integrated processing controlled by embedded software or firmware. It is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation. Therefore, in the interest of brevity and minimization of any risk of obscuring the principles and concepts according to the present invention, further discussion of such software and ICs, if any, will be limited to the essentials with respect to the principles and concepts of the various embodiments.

Referring to FIG. 1, a simplified and representative high level diagram of a receiver using a noise blanker 100, where the noise blanker is selectively and automatically enabled when appropriate in accordance with one or more embodiments will be briefly discussed and described. In FIG. 1, an antenna 101 or the like is coupled to a radio frequency (RF) function 103 (in some embodiments via RF switch 129 discussed below). The RF function is known and operates to amplify, broadband filter, and, using a mixer and local oscillator (not specifically shown), down convert RF signals available from the antenna, e.g. FM signals in a frequency band around 100 MHz in one or more embodiments, to an Intermediate Frequency (IF) signal at output 105. In various embodiments a desired signal corresponding to the channel (one of many) the receiver is tuned to is centered at the IF frequency, e.g., 10.8 MHz. Unfortunately, the antenna via normal RF signal propagation and absorption or the RF function via various forms of coupling may also receive or otherwise provide noise, e.g., impulse noise or ignition noise or "pop" or transient induced noise as a portion of or together with the desired IF signal.

The IF signal (including any noise—hereinafter with noise unless otherwise noted) is coupled to an IF and analog to digital converter (A/D) function 107. The IF and A/D function are also known. The IF portion operates to attenuate all signals other than the desired signal centered at the IF frequency, e.g., 10.8 MHz, amplify the desired signal, and down convert the desired signal from the IF frequency to a base band (near zero) frequency. The A/D converts the base band signal from an analog format to a digital format and this digital signal (including undesired noise if any) is provided at the output 109 of the IF function. In various exemplary embodiments this digital signal will be a frequency modulated signal (e.g., FM stereo broadcast signal centered about 0 or near 0 Hz) and comprises 24 bit complex samples at a rate of 480 thousand samples per second (KS/s).

This digital signal at output 109 is coupled to a baseband processing unit 111. Much or all of the baseband processing unit can be implemented in an integrated circuit form comprising hardware or hardware together with some form of a known processor (digital signal processor, reduced instruction set processor, or the like) executing firmware and performing numerical processing on the samples of the signal at output 109. Note that the block diagram has been simplified and various functional entities that may be present in some embodiments, e.g., Radio Data System (RDS), Equalizer, etc. functions, have not been shown in order to avoid any undue complexities and minimize any risk of obscuring the present inventive concepts and principles.

The base band processing unit 111 includes, inter coupled as depicted, a known FM demodulator 113 for demodulating the digital signal at output/input 109 to provide a demodulated signal, an audio blanker 115 configured for executing a known blanker algorithm to mitigate noise or impulse noise associated with the signal received by the radio receiver, i.e., the digital baseband signal at 109, a blanker controller 117 that is configured to selectively enable or otherwise control the audio blanker 115 as well as a known audio processing block 119 for various audio processing operations (e.g., stereo decoding).

The FM demodulator 113 is configured to demodulate a frequency modulated (FM) received signal, e.g., the signal at 109 to provide a demodulated signal for audio processing. The signal at the output of the FM demodulator at 201 is a base band MPX signal at a sample rate of 480 KS/s where each sample is 24 bits. As is known, in broadcast FM, an MPX signal includes Left+Right channels in the 0-15 KHz frequency band, a pilot signal at 19 KHz, Left-Right channels centered at 38 KHz, possibly a narrow band RDS signal centered at 57 KHz, as well as possibly other higher frequency components that are not relevant to the present discussions.

The output signal(s) from the audio processing block 119 (Left and Right channels) are passed to a digital to analog converter (DAC) 121, then to 123 audio amplifiers and from there to speakers or the like (not specifically shown). The audio blanker 115 may use an adaptive predictor algorithm, such as the algorithm described in co-pending application Ser. No. 10/216,333 (US Publication 2004/0203551), assigned to the same assignee and hereby incorporated herein in its entirety. The adaptive predictor audio blanker essentially predicts what the next few samples of the audio will be and when noise is detected substitutes the predicted samples for the samples that may be corrupted by excess noise. Other techniques for audio blanking that are known and may be used for the audio blanker include repeating the last noise free sample when noise has been detected or a linear interpolation between the last and next noise free sample of the audio. It is noted that none of these provides a perfect (non-degraded) version of the resultant audio and thus it is important to only enable the audio blanker when noise is present. Therefore the blanker controller 117 is an important element for providing a good noise blanker.

The blanker controller 117 is shown with the baseband digital signal at 109 as one input and the FM demodulator 113 output signal (MPX signal) as a second input, and if/when the receiver is equipped with diversity (diversity elements depicted with dashed lines) a third input from a diversity switching controller 125. The diversity controller is shown with an input coupled to the output of the audio blanker and operates as is known to control whether a second antenna 127 is coupled to the RF portion by controlling the RF switch 129. Generally the diversity controller occasionally switches from one antenna to another for a very short time period and tests whether the audio signal is better. If so, a switch over to the antenna that was found to be better will be performed.

Figure 2:
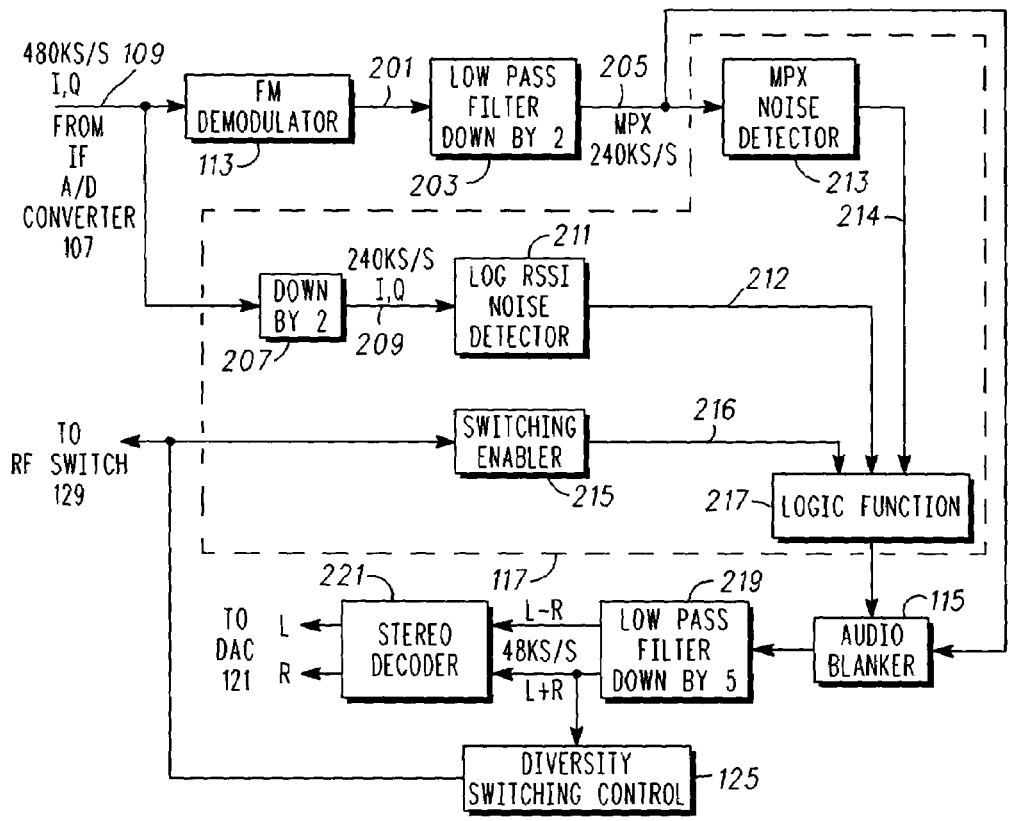
FIG. 2 shows a representative block diagram of a blanker controller that may be used to selectively and automatically control or enable an audio blanker included in the receiver of FIG. 1 in accordance with one or more embodiments.

Referring to FIG. 2, a representative block diagram of a blanker controller, e.g., blanker controller 117, (including some elements of the base band processing unit 111) that may be used to selectively and automatically control or enable the audio blanker 115 included in the receiver of FIG. 1 will be briefly discussed and described. FIG. 2 shows the complex digital base band signal, i.e., an FM modulated signal, from the output 109 of the IF/ADC function 107, coupled to an input to the FM demodulator 113 and an input of the blanker controller 117. The FM demodulator 113 and thus the demodulated signal or MPX signal is coupled, at an output 201, to a low pass filter and down sampler (by 2) 203. In some embodiments, the low pass filter is a known digital filter, e.g., Finite Impulse Response (FIR) filter or other filter architectures, and will have a cutoff frequency around 120 KHz. The down sampler essentially discards every other sample and provides, at output 205, the MPX signal at 240 KS/s to the blanker controller 117 and the audio blanker 115.

Also shown is the Diversity Switching Control function 125 that is coupled to the blanker controller 117 and RF switch 129. Note that the Diversity Switching Control function 125 is used as a representative function that may result in a state change in the receiver that could generate some form of transient noise that the audio blanker may be advantageously used to mitigate. If other state changes or switching actions are performed in a given implementation (e.g., switching from analog to digital modulated signals, etc.) the blanker controller may also be used advantageously.

In more detail, the blanker controller 117 is configured to selectively enable the audio blanker and further comprises at least a first blanker enabler and a second blanker enabler, e.g., one or more noise detectors and switching enablers. In some embodiments the blanker controller 117, as depicted, further comprises a first noise detector, e.g., MPX noise detector 213 that is configured to enable, via the MPX enable signal at 214, the audio blanker when impulse noise is detected in a demodulated signal, e.g., the MPX signal at 205. The MPX noise detector will be further described below with reference to FIG. 4.

The blanker controller 117 in some embodiments further includes a second noise detector, e.g., a log received signal strength indicator (log RSSI) noise detector 211 which is intercoupled via the down sampler (by 2) 207 to the (240 KS/s) complex modulated signal at 209, and configured to enable the audio blanker, via the log RSSI enable signal at 212, when impulse noise is detected in the modulated signal. The down sampler 207 essentially discards every other sample of the signal from the IF/ADC at 109. Note that no filter is required in front of the down sampler since the output signal is merely being used to detect noise and thus protecting the modulation information from aliasing effects typically is not necessary. Note that the modulated and demodulated signals correspond to the signal (including any noise) that is being received by the radio receiver.

The blanker controller in some embodiments may further comprise a switching enabler 215 that is configured to enable, via the switch enable signal at 216, the audio blanker, e.g., at a particular time and for a predetermined time period. As shown, the switching enabler can be arranged to be responsive to a diversity switching signal or other switching signal as provided by the diversity switching controller 125 or otherwise and by enabling the audio blanker appropriately can facilitate mitigation of noise resulting from switching transients or any transients due to a state change. When a switch over from one antenna to another for operational purposes is performed it is often beneficial to enable the audio blanker. The details (appropriate starting times and duration) and whether to enable the blanker can readily be experimentally determined for a given receiver and audio blanker implementation.

The blanker controller also includes a logic function 217 that the respective signals, e.g., MPX enable signal at 214, log RSSI enable signal at 212, and switch enable signal at 216 as well as any other enable signals are coupled to in one or more embodiments. The logic function can be, e.g., an OR gate in simple cases or more complex function, if needed, that provides an appropriate enable signal to the audio blanker whenever any one of the enable signals is present. Since the particular timing characteristics associated with each enable signal may vary, it may be more efficient for these signals to be provided with appropriate timing characteristics (e.g., start and duration), however in other embodiments the logic function 217 could provide these characteristics.

The output of the audio blanker 115 is a signal that has various noise elements removed or suppressed and is coupled to the audio processing function 119. The audio function includes, in some embodiments a low pass filter and down sampler (by 5) 219. Before the low pass filter and down sampler 219 or as a first function therein a known 38 KHz mixer (not shown) that down converts the L−R signal to audio band is provided. The low pass filter will have a cutoff or corner frequency around 24 KHz and may be implemented as an FIR filter or as another known filter architecture. The down sampler essentially discards 4 out of 5 samples. The output of the low pass filter and down sampler 219 includes various information, e.g., L+R and L−R, at a 48 KS/s rate. The L+R and L−R information are decoded and blended at a known stereo decoder 221 that supplies the resultant L and R audio channel to the DAC 121. Also at least the L+R signal is coupled to the diversity switching controller and used to assess whether the signal from the first or second antenna is better or otherwise indicate a need to switch antennas via known techniques.

Thus, FIG. 2 depicts a noise blanker controller 117 that is arranged and constructed to selectively enable an audio blanker 115 that is used in a radio receiver. This noise blanker controller includes a first noise detector, e.g., MPX noise detector 213, that is configured to provide a first signal (MPX enable signal at 214) when impulse noise is detected in a demodulated signal, where the demodulated signal corresponds to a signal received by the radio receiver. Further, the noise blanker controller includes a second noise detector, e.g., log RSSI noise detector 211, that is configured to provide a second signal (log RSSI enable signal at 212) when impulse noise is detected in a modulated signal, where the modulated signal corresponds to the signal received by the radio receiver.

The noise blanker controller also includes a logic function 217 that is coupled to the first signal and the second signal and configured to provide an enable signal when at least one of the first signal and the second signal are provided, where the enable signal is suitable for enabling the audio blanker. In some embodiments, the noise blanker controller may also include a switching enabler 215 that is responsive to a switching signal, e.g., diversity switching signal and configured to provide a third signal to the logic function. In this instance, the logic function, responsive to the third signal, is configured to provide the enable signal to the audio blanker at a particular time and for a predetermined time period and thus facilitate mitigation of noise in the audio resulting from switching transients.

Figure 3:
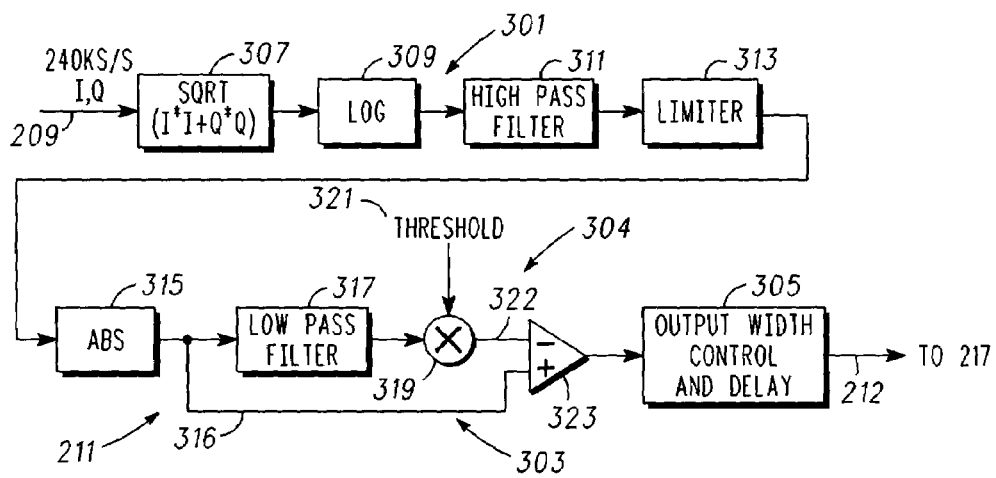
FIG. 3 shows a representative block diagram of log RSSI noise detector that may be used in the blanker controller of FIG. 2 in accordance with one or more embodiments.

Referring to FIG. 3, a representative and more detailed block diagram of a log RSSI noise detector, e.g., detector 211, that may be used in the blanker controller of FIG. 2 will be discussed and described. FIG. 3 shows the complex I,Q signal with 240 KS/s sample rate at 209 as an input to an RSSI function 301. The RSSI function is coupled to a comparator function 303 and an averaging function 304. The comparator function is coupled to an output function or stage 305. Each of these elements will be explained in further detail below.

The RSSI function includes a square root function 307 where the I and Q signals are first squared, then added together and last the square root of the sum is taken with the result (a real signal) provided to a log function 309 which generates a log RSSI value or signal corresponding to the modulated signal. Note that the square root and log functions may be determined or calculated with precision or may utilize various approximations in order to simplify calculations or reduce the amount of processor resources (reduce MIPs) that are devoted to these operations. For example as is known, the combined log square root function may be estimated as a linear function between any two points where this approximation becomes more accurate as the points are moved closed together. For example the log of the square root of $I^2+Q^2$ may be approximated as A+B*(0.4*(the absolute value of the smaller of I and Q)+absolute value of the larger), where A and B are linear interpolation coefficients stored in a look-up table for a small range of the input. Furthermore, if the receiver uses or includes an Automatic Gain Control (AGC) function as is typical, this AGC function is often implemented as part of or in front of the FM demodulator and can use a log RSSI operation. The same log RSSI operation or function may be used as part of the log RSSI noise detector.

The log function 309 provides a log (base 10) of the square root result from 307, i.e., the log RSSI value, to a high pass filter 311. The high pass filter in some embodiments has a corner frequency around 75 KHz and may be implemented as a first order Infinite Impulse Response (IIR) filter or other similar filter architecture. Since the log RSSI noise detector is expected to detect noise, the objective of the high pass filter is to eliminate or reduce modulation signal energy in favor of noise energy and the modulation signal energy is normally located in the lower frequency area of the composite signal spectrum while the noise energy typically covers all frequencies. With the suggested IIR filter approximately 50 dB of attenuation can be expected in the lower frequencies.

The output from the high pass filter 311 is coupled to a limiter 313. The limiter operates to eliminate unduly large values. Note the limiter can be implemented by simply ignoring values of the digital signals that exceed so many bits, i.e., with a register of x bits with any overflows discarded, where x may be experimentally determined by one of ordinary skill given a particular system implementation. The output of the limiter 313 is coupled to an ABSolute value function (ABS) 315 where the absolute value of the limiter result is taken. The output signal from the ABS 315 is a signal corresponding to the log RSSI value and is provided at 316 to a low pass filter 317.

The low pass filter 317 and a multiplier 319 are included in the averaging function 304. The low pass filter 317 essentially takes the average of the signal at the output 316 of the ABS 315 and provides this average to a weighting function or multiplier 319. The low pass filter in some embodiments can be implemented as an IIR filter with a cutoff or corner frequency around 100 Hz. This will provide approximately 50 dB of rejection for higher frequency signals and a reasonably good average. The multiplier 319 is arranged and configured to multiply or weight the average by a threshold value 321 and provide a signal that corresponds to the average to an input (−input) 322 of a comparator 323.

The comparator as intercoupled and the averaging function 304 comprise the comparator function 303. Another input (+input) of the comparator is coupled to the output 316 of the ABS 315. The comparator 323 thus compares and determines whether a first signal, e.g., output signal from ABS, corresponding to the log RSSI value exceeds a second signal, e.g., output signal from multiplier 319 corresponding to an average value of the first signal, and if so, i.e., when noise is detected, provides a comparator signal to an output stage 305.

The output stage, responsive to the signal from the comparator, is configured to generate or provide a signal or enable signal and control timing parameters, such as a start time or relative start time and time period or time duration associated with the signal at output 212. The time period may vary but in one embodiment a period of approximately 84 micro seconds or 20 sample periods was found to be adequate. The start time will depend on various delay factors associated with a given receiver and audio blanker and may readily be experimentally found or determined. The signal at output 212 is coupled to the logic function 217 as an enable signal or otherwise used to provide an enable signal to the audio blanker.

FIG. 3 and the discussion above thus describe a log RSSI noise detector 211 that further comprises an RSSI function 301 coupled to an averaging function 304 and a comparator function 303. The RSSI function is configured to provide a log RSSI value corresponding to the modulated signal. The comparator function is configured to provide a comparator signal when a signal corresponding to the log RSSI value exceeds an output signal provided by the averaging function, where the output signal corresponds to an average of the signal. The log RSSI noise detector further comprises a multiplier 319 arranged to weight the average of the signal in accordance with a threshold 321 and provide the output signal. The log RSSI noise detector additionally includes in some embodiments an output stage 305 that is configured to provide the second enable signal to the logic function 217 from the log RSSI noise detector and control timing parameters associated with the enable signal.

Figure 4:
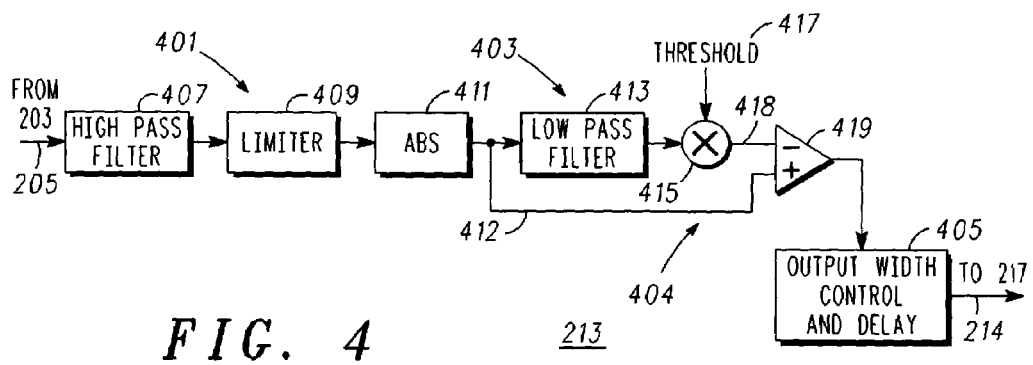
FIG. 4 shows a representative block diagram of a Multiplex (MPX) noise detector that may be used in the blanker controller of FIG. 2 in accordance with one or more embodiments.

Referring to FIG. 4, a representative block diagram of a Multiplex (MPX) noise detector that may be used in the blanker controller of FIG. 2 in accordance with one or more embodiments will be discussed and described. FIG. 4 depicts the first noise detector, e.g., MPX noise detector 213. The architecture of the MPX noise detector is similar to the log RSSI noise detector with specific differences such as the RSSI function. The MPX noise detector 213 comprises an amplitude function 401 coupled to an averaging function 403 and a comparator function 404. The amplitude function is configured to provide an amplitude value corresponding to the demodulated signal, e.g., the MPX signal from 203 at 205, and the comparator function 404 is configured to provide a comparator signal when the amplitude value exceeds an output signal provided by the averaging function 403, where the output signal corresponds to an average of the amplitude values. The MPX noise detector also comprises output stage 405 that is coupled to the comparator signal and configured to provide, when noise is detected, a signal at 214 or enable signal for the audio blanker or signal to be used by the logic function 217 and control timing parameters associated with the signal.

In more detail the MPX signal at 205 is applied to a high pass filter 407 that filters the MPX signal and forwards it to limiter 409. The high pass filter may be implemented in some embodiments as a FIR filter with 42 taps and a cut off or corner frequency of 75 KHz and operates as noted above to suppress the audio, etc. components after demodulation in favor of the noise components. The limiter may be implemented as noted above by ignoring overflows beyond a certain number of bits. The output of the limiter and limited signal is coupled to ABS function 411 where an absolute value of its input is obtained. The resultant signal out of the ABS at 412 is an amplitude value that corresponds to the demodulated signal or more specifically the noise that is part of the demodulated signal.

The resultant signal at 412 is coupled to a low pass filter 413 that operates to average the amplitude values and provide the average to a multiplier 415. The low pass filter 412 can be implemented in some embodiments as a first order IIR filter with a corner frequency at 400 Hz thereby providing approximately 50 dB of attenuation for higher frequency components. The multiplier 415 is arranged to weight the average of amplitude values in accordance with or multiply the average by a threshold 417 and provide an output signal corresponding to the average at an input 418 (−input) of comparator 419.

The comparator 419, as intercoupled, and the averaging function 403 comprise the comparator function 404. Another input (+input) of the comparator is coupled to the output 412 of the ABS 411 or amplitude value corresponding to the demodulated signal. The comparator 419 thus compares and determines whether a first signal, e.g., amplitude value, exceeds a second signal, e.g., output signal corresponding to an average of the amplitude values provided by the averaging function (specifically from multiplier 415), and if so, i.e., when noise is detected in the demodulated signal, provides a comparator signal to an output stage 405. The output stage 405 operates in an analogous fashion to the output stage 305 thus providing a signal to enable or to be used to enable the audio blanker with appropriate starting times and time durations where these timing parameters may be experimentally determined for a given receiver and audio blanker. Generally and consistently with the log RSSI noise detector the timing parameters should be chosen to enable the audio blanker coincidentally with the noise being present at the audio blanker and for the expected duration of the noise.

Figure 5:
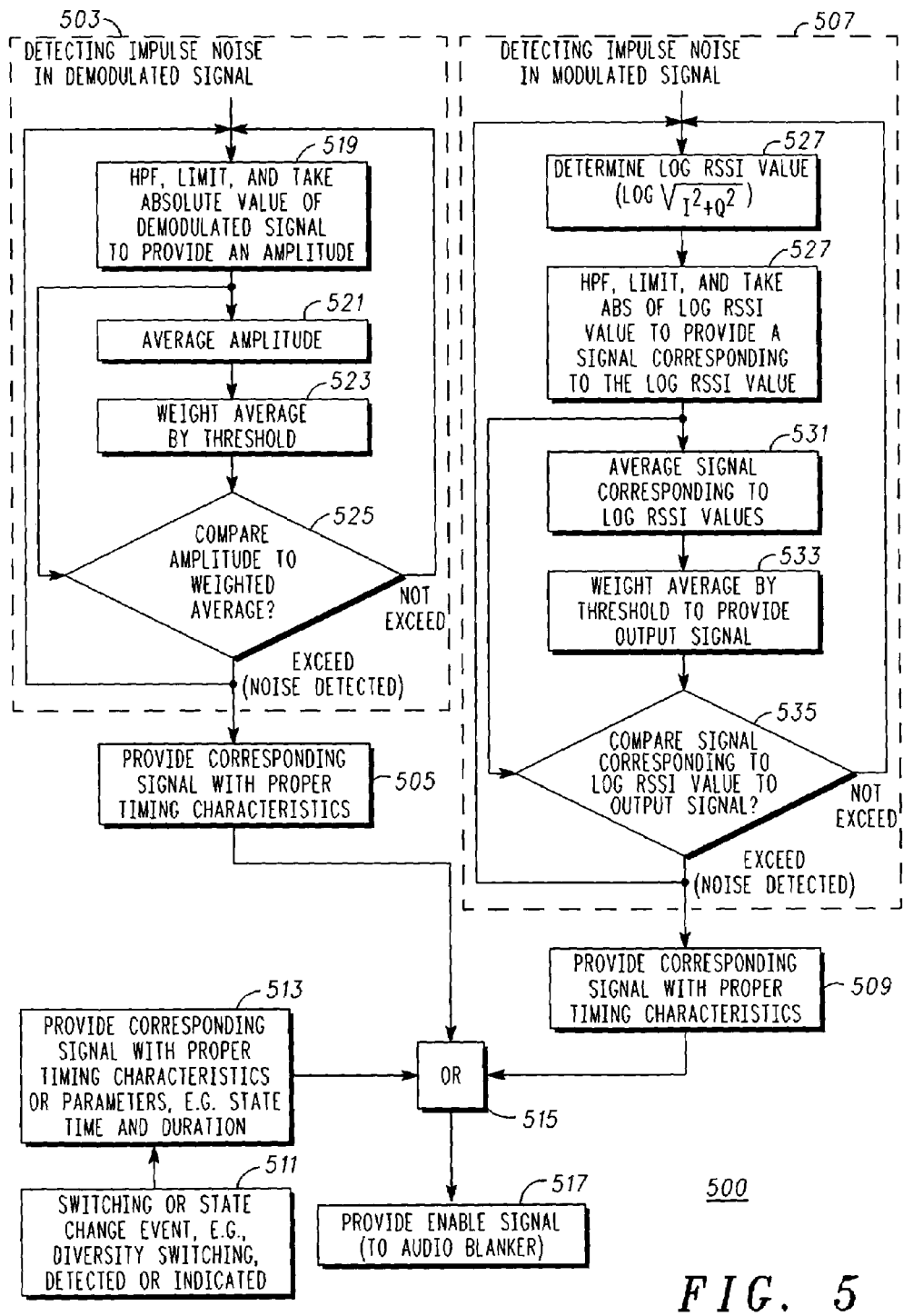
FIG. 5 shows a flow chart illustrating representative embodiments of methods of controlling a noise blanker used in a radio receiver.

Referring to FIG. 5 a representative embodiment of methods of controlling a noise blanker used in a radio receiver in accordance with one or more embodiments will be discussed and described. It will be appreciated that this method uses many of the inventive concepts and principles discussed in detail above and thus this description will be somewhat in the nature of a summary with various details generally available in the earlier descriptions. This method can be implemented in one or more of the structures or apparatus described earlier or other similarly configured and arranged structures. FIG. 5 shows an embodiment of a method 500 that is arranged and configured to control a noise blanker such as those that can be used in a radio receiver such as an FM broadcast receiver.

The method 500 includes detecting impulse noise in a demodulated signal 503 where the demodulated signal corresponds to a signal received by the radio receiver and when the impulse noise is detected, providing a corresponding signal 505 that in some embodiments includes appropriate timing characteristics. Additionally, the method includes detecting impulse noise in a modulated signal 507 where the modulated signal again corresponds to the signal received by the radio receiver and when the impulse noise is detected, providing a corresponding signal 509 that in some embodiments includes appropriate timing characteristics. The method in some embodiments can also include generating a signal responsive to detecting a state change 511 in the radio receiver and providing a corresponding signal 513 with appropriate timing parameters (predetermined time period and start time). The signals as provided at 505, 509 and 513 are all coupled and logically combined, e.g., ORed 515. When any signal is available from 505, 509 or 513, an enable signal is provided 517 that is suitable for enabling the noise blanker, thus mitigating impulse noise or noise resulting from switching transients and the like.

The process of detecting impulse noise in the demodulated signal 503 in one or more embodiments includes high pass filtering, limiting and taking absolute value 519 of the demodulated signal to provide an amplitude. Averaging the amplitudes to provide an average 521 and weighting the average in accordance with a threshold 523 to provide a weighted average. The amplitude from 519 is compared 525 to the weighted average and if the weighted average is not exceeded the next sample of the demodulated signal is processed beginning at 519. If the weighted average is exceeded by the amplitude impulse noise has been detected and the process at 505 is performed as earlier noted and the next sample of the demodulated signal is processed beginning at 519.

Detecting impulse noise in the modulated signal 507 in one or more embodiments includes determining a log received signal strength indicator (log RSSI) value 527 corresponding to the modulated signal. Next the log RSSI value is high pass filtered, limited and the absolute value is taken in order to provide a signal corresponding to the log RSSI value 529. An average of the signal corresponding to log RSSI values is found 531 and providing a signal corresponding to the average is done at 533. More specifically, weighting the average of the signal corresponding to log RSSI values in accordance with a threshold is performed 533 to provide an average or output signal that corresponds to the average. A comparison 535 of the signal from 529 with the output signal determines whether impulse noise is detected. If the signal corresponding to the log RSSI value does not exceed the output signal (weighted average) noise has not been detected and the next sample of the modulated signal is processed from 527. If the signal exceeds the output signal, noise has been detected and providing the corresponding signal 509 in addition to processing the next sample from 527 is undertaken. Note that the method 500 or any portion thereof may be repeated as needed.

Figure 6:
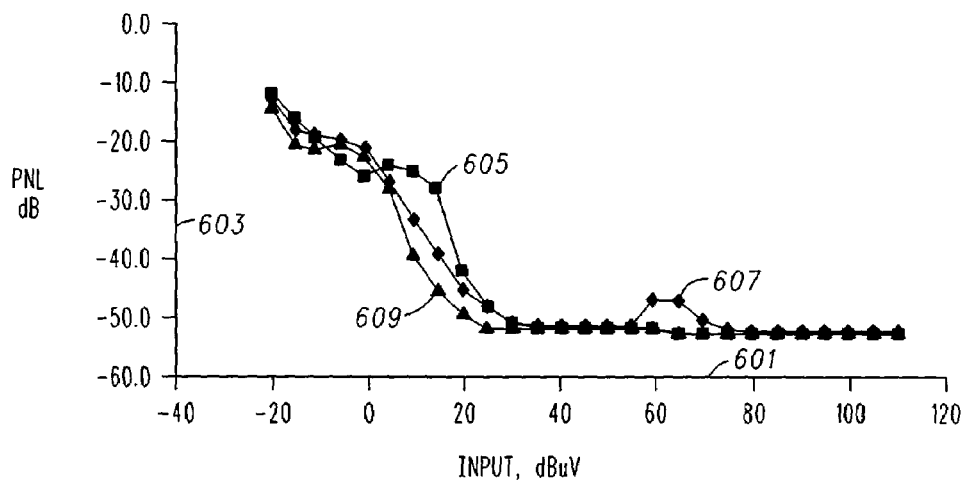
FIG. 6 depicts a representative diagram of various comparative performance data that has been experimentally derived.

Referring to FIG. 6, a representative diagram of various comparative performance data that has been experimentally derived will be discussed and described. The data in FIG. 6 is generated by initially coupling an FM modulated input signal to a receiver (e.g., modulation 400 Hz with 75 KHz modulation index) with a noise blanker and measuring audio output as a function of the input signal level. This is defined as 0 dB. Next the modulation is turned off and a standardized noise signal with large and short duration noise spikes at a rate within the audio band (e.g., 1000 Hz) is combined with the unmodulated input signal. The residual noise level is measured at the audio output and plotted relative to the 0 dB level. This input signal level is on the horizontal axis 601 while the residual noise level relative to 0 dB, referred to as PNL, is read on the vertical axis 603. The line 605 shows the PNL using only the demodulated (MPX) noise detector. Line 607 is the PNL using only the modulated (log RSSI) noise detector. Line 609 shows the PNL using both the MPX and log RSSI noise detectors. It is noted that significant improvement in PNL is available with both detectors at low input signal levels (0-20 dB microvolt) as well as intermediate input levels (55-70 dB microvolt).

The processes, apparatus, and systems, discussed above, and the inventive principles thereof are intended to and can alleviate noise blanker issues caused by prior art noise detection apparatus and techniques as well as noise due to transients. Using these principles of using a plurality of noise blanker enablers, e.g., one or more noise detectors or one or more switching enablers can provide additional noise mitigation or reduction that will result in improved end user satisfaction.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A noise blanker for use in a radio receiver, the noise blanker comprising:
   an audio blanker configured to mitigate impulse noise associated with a signal received by the radio receiver; and
   a blanker controller configured to selectively enable the audio blanker and further comprising at least a first blanker enabler and a second blanker enabler, the first and the second blanker enabler concurrently operable to selectively enable the audio blanker,
      wherein the blanker controller comprises a switching enabler configured to enable the audio blanker for a predetermined time period, and wherein the switching enabler is responsive to a diversity switching signal and facilitates mitigation of noise resulting from switching transients.

2. The noise blanker of claim 1 wherein the blanker controller further comprises a first noise detector configured to enable the audio blanker when impulse noise is detected in a demodulated signal and a second noise detector configured to enable the audio blanker when impulse noise is detected in a modulated signal, the modulated and demodulated signal corresponding to the signal received by the radio receiver.

3. The noise blanker of claim 1 wherein the blanker controller comprises a log received signal strength indicator (log RSSI) noise detector.

4. A noise blanker for use in a radio receiver, the noise blanker comprising:
an audio blanker configured to mitigate impulse noise associated with a signal received by the radio receiver; and
a blanker controller configured to selectively enable the audio blanker and further comprising at least a first blanker enabler and a second blanker enabler, the first and the second blanker enabler concurrently operable to selectively enable the audio blanker,
wherein the blanker controller comprises a log received signal strength indicator (log RSSI) noise detector, and
wherein the log RSSI noise detector further comprises an RSSI function coupled to a comparator function, the RSSI function configured to provide a log RSSI value, to comparator function configured to determine whether a first signal corresponding to the log RSSI value exceeds a second signal corresponding to an average value of the first signal.

5. The noise blanker of claim 3 wherein the log RSSI noise detector further comprises an output stage configured to control timing parameters associated with an enable signal that is coupled to the audio blanker.

6. A noise blanker controller arranged and constructed to selectively enable an audio blanker used in a radio receiver, the noise blanker controller comprising:
a first noise detector configured to provide a first signal when impulse noise is detected in a demodulated signal, the demodulated signal corresponding to a signal received by the radio receiver;
a second noise detector configured to provide a second signal when impulse noise is detected in a modulated signal, the modulated signal corresponding to the signal received by the radio receiver; and
a logic function coupled to the first signal and the second signal and configured to provide an enable signal when one or more of the first signal and the second signal are provided, the enable signal suitable for enabling the audio blanker,
wherein the first noise detector further comprises an amplitude function coupled to an average function and a comparator function, the amplitude function configured ad to provide an amplitude value corresponding to the demodulated signal and the comparator function configured to provide a comparator signal when the amplitude value exceeds an output signal provided by the averaging function, the output signal corresponding to an average of amplitude values.

7. The noise blanker controller of claim 6 wherein the first noise detector further comprises:
a multiplier arranged to weight the average of amplitude values in accordance with a threshold and provide the output signal; and an output stage coupled to the comparator signal and configured to provide the first signal and control timing parameters associated with the first signal.

8. The noise blanker controller of claim 6 wherein the second noise detector further comprises a log received signal strength indicator (log RSSI) noise detector.

9. The noise blanker controller of claim 8 wherein the log RSSI noise detector further comprises an RSSI function coupled to a second averaging function and a second comparator function, the RSSI function configured to provide a log RSSI value corresponding to the modulated signal and the comparator function configured to provide a second comparator signal when a signal corresponding to the log RSSI value exceeds a second output signal provided by the second averaging function, the second output signal corresponding to an average of the signal.

10. The noise blanker controller of claim 9 wherein the log RSSI noise detector further comprises a multiplier arranged to weight the average of the signal in accordance with a threshold and provide the second output signal.

11. The noise blanker controller of claim 8 wherein the log RSSI noise detector further comprises an output stage configured to provide the second signal and control timing parameters associated with the second signal.

12. The noise blanker controller of claim 6 further comprising a switching enabler that is responsive to a switching signal and configured to provide a third signal to the logic function, the logic function, responsive to the third signal, configured to provide the enable signal to the audio blanker for a predetermined time period.

13. A noise blanker controller arranged and constructed to selectively enable an audio blanker used in a radio receiver, the noise blanker controller comprising:
a first noise detector configured to provide a first signal when impulse noise is detected in a demodulated signal, the demodulated signal corresponding to a signal received by the radio receiver;
a second noise detector configured to provide a second signal when impulse noise is detected in a modulated signal, the modulated signal corresponding to the signal received by the radio receiver;
a logic function coupled to the first signal and the second signal and configured to provide an enable signal when one or more of the first signal and the second signal are provided, the enable signal suitable for enabling the audio blanker; and
a switching enabler that is responsive to a switching signal and configured to provide a third signal to the logic function, the logic function, responsive to the third signal, configured to provide the enable signal to the audio blanker for a predetermined time period, wherein the switching enabler is responsive to a diversity switching signal and facilitates mitigation of noise resulting from switching transients.

14. A method of controlling a noise blanker used in a radio receiver, the method comprising:
detecting first impulse noise in a demodulated signal corresponding to a signal received by the radio receiver and when the first impulse noise is detected, providing a first signal;
detecting second impulse noise in a modulated signal corresponding to the signal received by the radio receiver and when the second impulse noise is detected, providing a second signal;
wherein the detecting second impulse noise further comprises:

determining a log received signal strength indicator (log RSSI) value corresponding to the modulated signal;

finding an average of a signal corresponding to log RSSI values and providing an average signal corresponding to the average; and providing the second signal when the signal exceeds the average signal; and providing an enable signal when one or more of the first signal and the second signal are provided, the enable signal suitable for enabling an audio blanker.

15. The method of claim 14 wherein the providing the average signal corresponding to the average of the signal further comprises weighting the average in accordance with a threshold.

16. The method of claim 14 further comprising generating a third signal responsive to a state change in the radio receiver and wherein the providing the enable signal further comprises providing, responsive to the third signal, the enable signal for a predetermined time period.

17. A method of controlling a noise blanker used in a radio receiver, the method comprising:

detecting first impulse noise in a demodulated signal corresponding to a signal received by the radio receiver and when the first impulse noise is detected, providing a first signal;

detecting second impulse noise in a modulated signal corresponding to the signal received by the radio receiver and when the second impulse noise is detected, providing a second signal;

providing an enable signal when one or more of the first signal and the second signal are provided, the enable signal suitable for enabling an audio blanker; and generating a third signal responsive to a state change in the radio receiver, wherein the providing the enable signal further comprises providing, responsive to the third signal, the enable signal for a predetermined time period, and wherein the generating the third signal is responsive to a diversity switching signal and the third signal facilitates mitigation of noise resulting from switching transients.

18. A noise blanker controller arranged and constructed to selectively enable an audio blanker used in a radio receiver, the noise blanker controller comprising:

a first noise detector configured to provide a first signal when impulse noise is detected in a demodulated signal, the demodulated signal corresponding to a signal received by the radio receiver;

a second noise detector configured to provide a second signal when impulse noise is detected in a modulated signal, the modulated signal corresponding to the signal received by the radio receiver;

a logic function coupled to the first signal and the second signal and configured to provide an enable signal when one or more of the first signal and the second signal are provided, the enable signal suitable for enabling the audio blanker, wherein the second noise detector further comprises a log received signal strength indicator (log RSSI) noise detector, and wherein the log RSSI noise detector further comprises an RSSI function coupled to an averaging function and a comparator function, the RSSI function configured to provide a log RSSI value corresponding to the modulated signal and the comparator function configured to provide a comparator signal when a signal corresponding to the log RSSI value exceeds an output signal provided by the averaging function, the output signal corresponding to an average of the signal.

* * * * *

UNITED STATES PATENT AND TRADEMARK OFFICE
CERTIFICATE OF CORRECTION

| | |
|---|---|
| PATENT NO. | : 7,440,737 B2 |
| APPLICATION NO. | : 11/215776 |
| DATED | : October 21, 2008 |
| INVENTOR(S) | : Jie Su |

It is certified that error appears in the above-identified patent and that said Letters Patent is hereby corrected as shown below:

Column 11 line 29 after the word "value," please delete "to" and insert --the--
Column 11 line 56 please delete "ad"

Signed and Sealed this

Thirtieth Day of December, 2008

JON W. DUDAS
*Director of the United States Patent and Trademark Office*